US010020338B2

(12) United States Patent
Hynecek et al.

(10) Patent No.: US 10,020,338 B2
(45) Date of Patent: Jul. 10, 2018

(54) BACKSIDE ILLUMINATED IMAGE SENSOR

(71) Applicant: Intellectual Ventures II LLC, Wilmington, DE (US)

(72) Inventors: Jaroslav Hynecek, Lake Oswego, OR (US); Leonard Forbes, Lake Oswego, OR (US); Homayoon Haddad, Lake Oswego, OR (US); Thomas Joy, Sunnyvale, CA (US)

(73) Assignee: INTELLECTUAL VENTURES II LLC, Wilmington, DE (US)

( * ) Notice: Subject to any disclaimer, the term of this patent is extended or adjusted under 35 U.S.C. 154(b) by 24 days.

(21) Appl. No.: 14/944,975

(22) Filed: Nov. 18, 2015

(65) Prior Publication Data

US 2016/0071900 A1 Mar. 10, 2016

Related U.S. Application Data

(60) Division of application No. 13/859,055, filed on Apr. 9, 2013, now Pat. No. 9,553,122, which is a division
(Continued)

(51) Int. Cl.
*H01L 21/00* (2006.01)
*H01L 27/146* (2006.01)
(Continued)

(52) U.S. Cl.
CPC .... *H01L 27/1464* (2013.01); *H01L 21/76898* (2013.01); *H01L 23/481* (2013.01);
(Continued)

(58) Field of Classification Search
CPC .......... H01L 27/1464; H01L 27/14643; H01L 27/14609; H01L 27/14632; H01L 27/14687; H01L 27/14689; H01L 27/14636; H01L 2223/54426; H01L 23/544; H01L 27/14627; H01L 27/14625; H01L 27/14621; H01L 31/1884
(Continued)

(56) References Cited

U.S. PATENT DOCUMENTS 4,708,766 A 11/1987 Hynecek
4,750,980 A 6/1988 Hynecek
(Continued)

FOREIGN PATENT DOCUMENTS

CN 1825609 A 8/2006
FR 2863773 A1 6/2005
(Continued)

OTHER PUBLICATIONS

Expanded European Search Report in European Application No. 121948905, dated Jan. 23, 2013.
(Continued)

*Primary Examiner* — Whitney T Moore
*Assistant Examiner* — Herve Assouman
(74) *Attorney, Agent, or Firm* — McAndrews, Held & Malloy, Ltd.

(57) ABSTRACT

A backside illuminated image sensor includes a substrate, a backside passivation layer disposed on backside of the substrate, and a transparent conductive layer disposed on the backside passivation layer.

18 Claims, 12 Drawing Sheets

Related U.S. Application Data of application No. 12/969,321, filed on Dec. 15, 2010, now Pat. No. 8,420,438, which is a continuation of application No. 12/255,194, filed on Oct. 21, 2008, now Pat. No. 7,875,948.

(51) Int. Cl.
*H01L 23/48* (2006.01)
*H01L 21/768* (2006.01)

(52) U.S. Cl.
CPC .. *H01L 27/14621* (2013.01); *H01L 27/14627* (2013.01); *H01L 27/14632* (2013.01); *H01L 27/14636* (2013.01); *H01L 27/14643* (2013.01); *H01L 27/14685* (2013.01); *H01L 27/14687* (2013.01); *H01L 27/14698* (2013.01); *H01L 2924/0002* (2013.01)

(58) Field of Classification Search
USPC ............ 438/57, 65, 66, 70, 98; 257/59, 228, 257/222, 258, 460
See application file for complete search history.

(56) References Cited

U.S. PATENT DOCUMENTS

| | | | |
|---|---|---|---|
| 5,292,682 | A | 3/1994 | Stevens et al. |
| 5,365,092 | A | 11/1994 | Janesick |
| 5,688,715 | A | 11/1997 | Sexton et al. |
| 5,814,810 | A | 9/1998 | Anagnostopoulos |
| 5,825,840 | A | 10/1998 | Anagnostopoulos |
| 5,891,752 | A | 4/1999 | Losee |
| 6,380,564 | B1 | 4/2002 | Chen et al. |
| 6,587,146 | B1 | 7/2003 | Guidash |
| 6,809,008 | B1 | 10/2004 | Holm et al. |
| 7,101,726 | B2 | 9/2006 | Yamamoto et al. |
| 7,498,650 | B2 | 3/2009 | Lauxtermann |
| 7,588,993 | B2 | 9/2009 | Liu et al. |
| 7,791,116 | B1* | 9/2010 | Rhodes ............... H01L 27/1461 257/291 |
| 7,875,948 | B2 | 1/2011 | Hynecek et al. |
| 2004/0137280 | A1* | 7/2004 | Abe ...................... C03C 17/245 428/702 |
| 2005/0104148 | A1 | 5/2005 | Yamamoto et al. |
| 2005/0118354 | A1 | 6/2005 | Ahn et al. |
| 2005/0255625 | A1 | 11/2005 | Janesick et al. |
| 2006/0006488 | A1* | 1/2006 | Kanbe ............... H01L 27/14632 257/443 |
| 2006/0043437 | A1 | 3/2006 | Mouli |
| 2006/0076590 | A1 | 4/2006 | Pain et al. |
| 2006/0094151 | A1 | 5/2006 | Sumi |
| 2006/0125038 | A1 | 6/2006 | Mabuchi |
| 2006/0187327 | A1 | 8/2006 | Mabuchi et al. |
| 2007/0012969 | A1 | 1/2007 | Mouli |
| 2007/0117254 | A1* | 5/2007 | Pain ................. H01L 27/14621 438/75 |
| 2007/0166956 | A1 | 7/2007 | Blanchard |
| 2007/0207566 | A1 | 9/2007 | Fu et al. |
| 2007/0210395 | A1* | 9/2007 | Maruyama ........ H01L 27/14609 257/431 |
| 2007/0234949 | A1 | 10/2007 | Ahn et al. |
| 2008/0001179 | A1 | 1/2008 | Roy |
| 2008/0188021 | A1 | 8/2008 | Tsai |
| 2008/0193791 | A1* | 8/2008 | Ahn ..................... C23C 8/02 428/640 |
| 2008/0308890 | A1* | 12/2008 | Uya ................. H01L 27/14603 257/437 |
| 2009/0124038 | A1* | 5/2009 | Tuttle ................ H01L 27/14643 438/70 |
| 2009/0146325 | A1* | 6/2009 | Liu ...................... H01L 23/544 257/797 |
| 2009/0201395 | A1 | 8/2009 | Manabe et al. |
| 2009/0233000 | A1 | 9/2009 | Wang et al. |

FOREIGN PATENT DOCUMENTS

| | | |
|---|---|---|
| JP | 08-204165 | 8/1996 |
| JP | 2006128392 | 5/2006 |
| JP | 2006-202865 | 8/2006 |
| KR | 20070070428 | 7/2007 |
| WO | WO2005046207 | 5/2005 |

OTHER PUBLICATIONS

International Search Report and Written Opinion for International Patent application No. PCT/US2009/061488 dated Feb. 11, 2010.
Mark Clampin, V-Optical CCD's, http://www.stsci.edu/stsci/meetings/space_detectors/clampin.htm.
G. Agostinelli et al., "Very Low Surface Recombination Velocities on p-type Silicon Wafers Passivated with a Dielectric with Fixed Negative Charge", Solar Energy Materials and Solar Cells, vol. 90, pp. 3438-3443 (2006).
Michael E. Hoenk et al., "Growth of a Delta-Doped Silicon Layer by Molecular Beam Epitaxy on a Charge-Coupled Device for Relection-Limited Ultraviolet Quantum Efficiency", Appl. Phys. Lett., vol. 61, No. 9, pp. 1084-1086 (1992).
Shouleh Nikzad et al., "Delta-Doped CCD's for Enhanced UV Performance", SPIE, vol. 2278, pp. 138-146 (1994).
M.P. Lesser, "Improving CCD Quantum Efficiency", SPIE, vol. 2198, pp. 782-791 (1994).
Michael Lesser et al., "Enhancing Back Illuminated Performance of Astronomical CCD's", SPIE, vol. 3355, pp. 446-456 (1998).
European Patent Office, Communication pursuant to Article 94(3) EPC, in European application No. 09 741 160.7 dated Jun. 27, 2012.
International Search Report and Written Opinion for International Patent application No. PCT/US2009/061488, dated May 5, 2011.

* cited by examiner

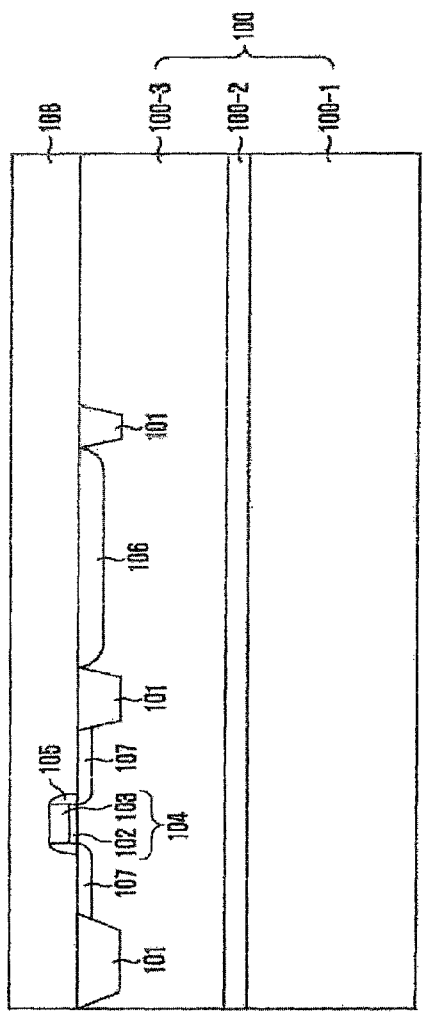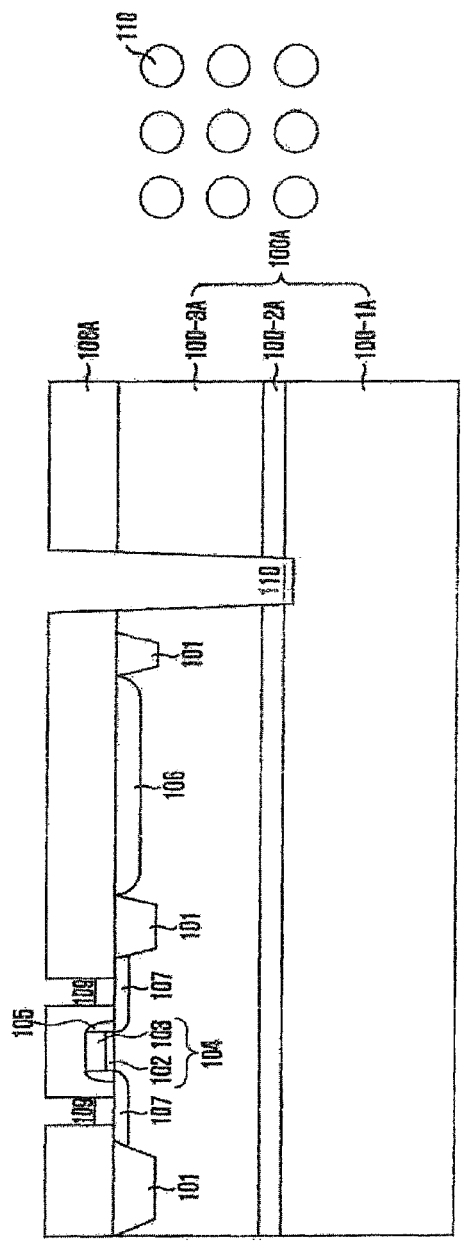
FIG. 2A
FIG. 2B

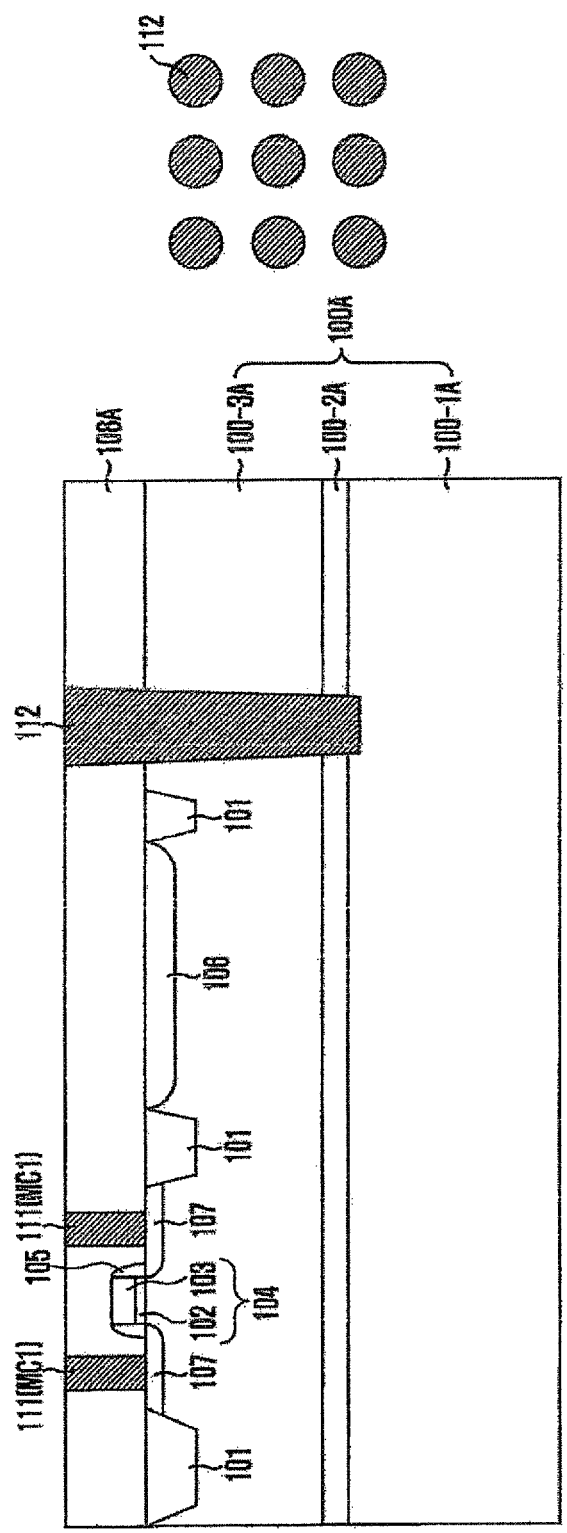

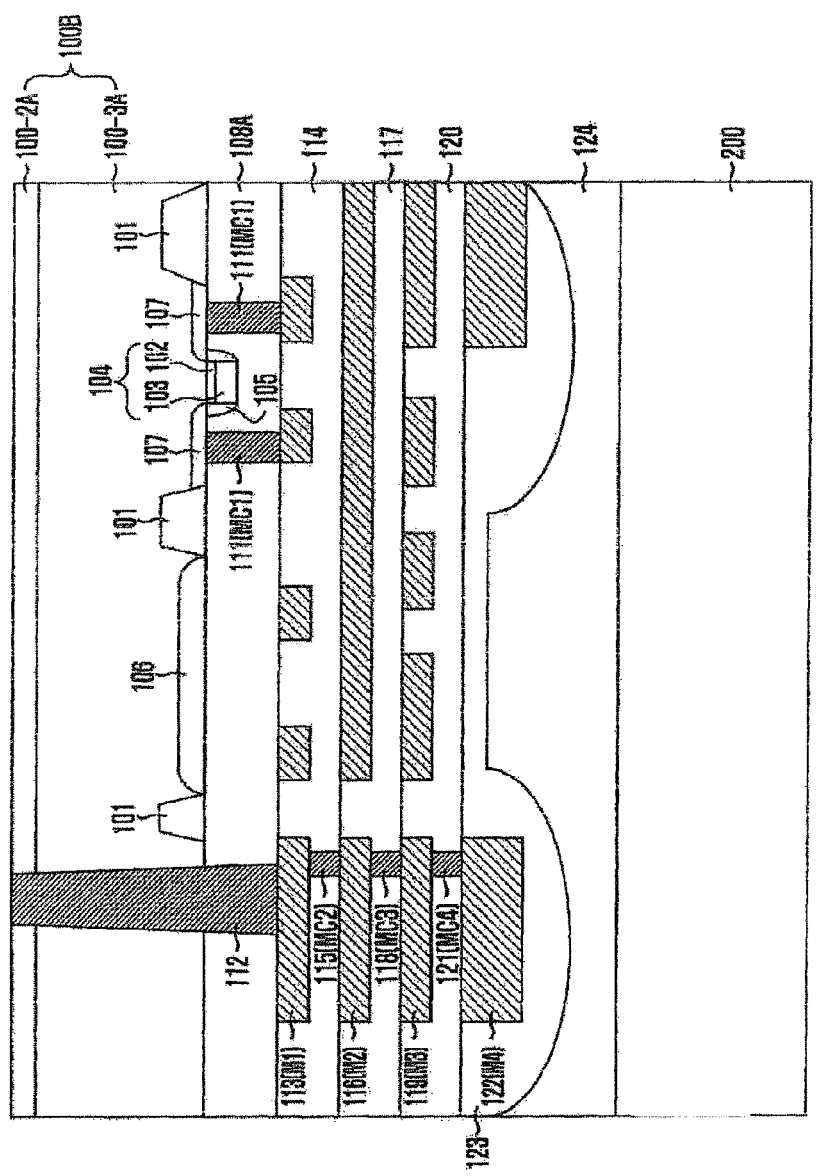

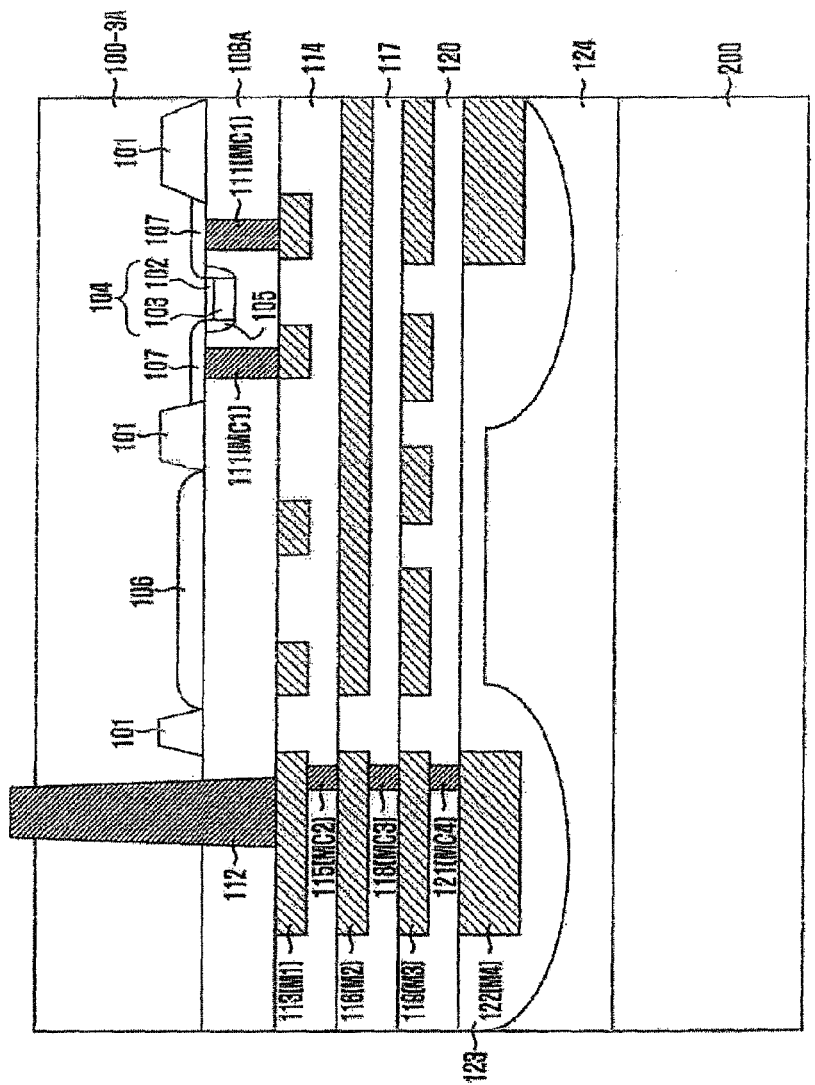

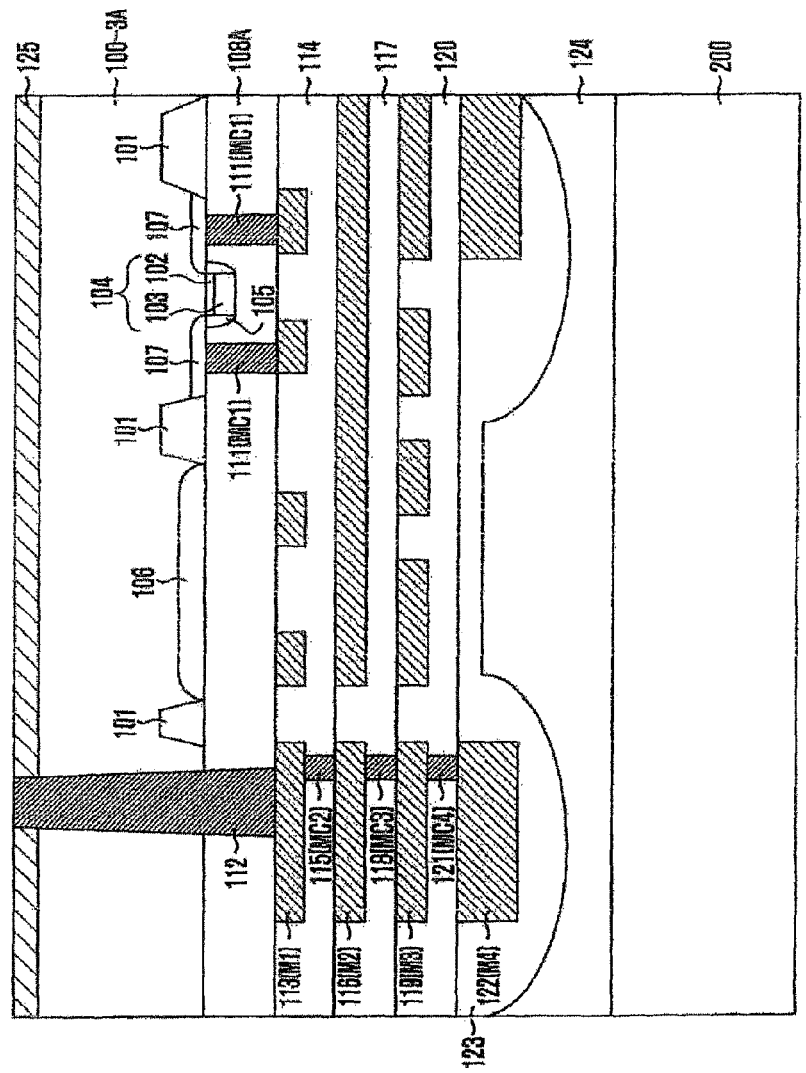

BACKSIDE ILLUMINATED IMAGE SENSOR

BACKGROUND OF THE INVENTION

The present invention relates to an image sensor, and more particularly, to the illuminated backside of a backside illuminated image sensor.

Generally, in a Complementary Metal Oxide Semiconductor Active Pixel Sensor (CMOS APS), which will be referred to as a CMOS image sensor hereinafter, a light receiving element, a digital control block, and a peripheral circuit such as an analog-to-digital converter are arranged in a limited area within a chip. Thus, an area ratio of a pixel array per a chip area is limited to about 40%. Also, since a pixel size is greatly reduced for implementation of high quality images, the amount of light that one light receiving element can collect is reduced and noise is increased, causing various problems such as image loss resulting from noise increase.

SUMMARY OF THE INVENTION

Embodiments of the present invention are directed to a backside-illuminated image sensor, in which light illuminates the backside of a substrate (which is the wafer).

In accordance with an aspect of the present invention, there is provided a backside illuminated image sensor including a substrate, a backside passivation layer disposed on backside of the substrate, and a transparent conductive layer disposed on the backside passivation layer.

In accordance with another aspect of the present invention, there is provided a backside illuminated image sensor including a light receiving element disposed in a first substrate, an interlayer insulation layer disposed on the first substrate having the light receiving element, an align key spaced apart from the light receiving element and passing through the interlayer insulation layer and the first substrate, a plurality of interconnection layers disposed on the interlayer insulation layer in a multi-layered structure, wherein the backside of the lowermost interconnection layer is connected to the align key, a front side passivation layer covering the interconnection layers, a backside passivation layer disposed on the backside of the first substrate, a transparent conductive layer disposed on the backside passivation layer and connected to the align key, and a color filter and a microlens disposed on the transparent conductive layer to face the light receiving element.

BRIEF DESCRIPTION OF THE DRAWINGS

FIGS. 2A to 2J are cross-sectional views describing a method for fabricating a backside illuminated image sensor in accordance with an embodiment of the present invention.

DESCRIPTION OF SPECIFIC EMBODIMENTS

Figure 1:
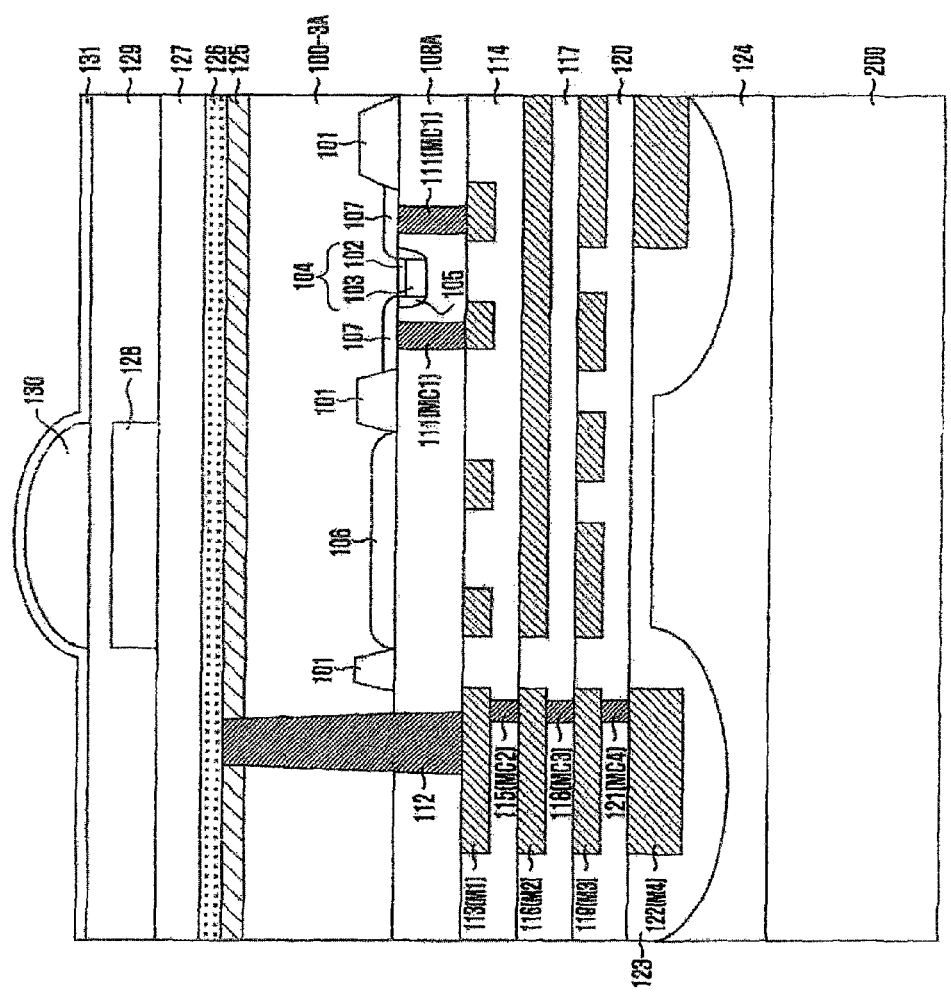
FIG. 1 is a cross-sectional view illustrating a backside-illuminated image sensor in accordance with an embodiment of the present invention.

Embodiments of the present invention relate to a backside illuminated image sensor in accordance with an embodiment of the present invention.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals throughout the various embodiments of the present invention represent the same or like elements in different drawings.

FIG. 1 is a cross-sectional view illustrating a backside illuminated image sensor in accordance with an embodiment of the present invention.

Only a photodiode and a gate electrode of a driving transistor in a unit pixel of a CMOS image sensor are illustrated in FIG. 1 for convenience.

Referring to FIG. 1, the backside illuminated image sensor in accordance with the embodiment of the present invention includes a second semiconductor pattern 100-3A, a backside passivation layer 125 disposed on backside of the second semiconductor pattern 100-3A, and a transparent conductive layer 326 disposed on the backside passivation layer 125.

The second semiconductor pattern 100-3A includes a p-type conductive material (hereinafter, a first conductive material). The second semiconductor pattern 100-3A is doped with p-type impurity ions such as boron (B) which is a member of a third family in a periodic table. The second semiconductor pattern 100-3A may include one layer selected from the group consisting of a silicon (Si) layer, a germanium (Ge) layer, a silicon germanium (SiGe) layer, a gallium phosphide (GaP) layer, a gallium arsenide (GaAs) layer, a silicon carbide (SiC) layer, a silicon germanium carbon (SiGeC) layer, an indium arsenide (InAs) layer, and a stack structure thereof. Preferably, the second semiconductor pattern 100-3A may include the Si layer. The second semiconductor pattern 100-3A may be a bulk substrate, of a substrate formed over a buried insulation layer in a Silicon On Insulator (SOI) layer. Also, the second semiconductor pattern 100-3A may be ah epitaxial layer disposed on the SOI substrate. In this embodiment, the substrate is the SOI substrate formed over the buried insulation layer in the SOI substrate.

The backside passivation layer 125 functions as an anti-reflection layer. The backside passivation layer 125 is a dielectric coating layer formed over an optical surface. The anti-reflection layer reduces a light reflection power of the optical surface in a predetermined range. Generally, an operation principle of the reduction in the light reflection power is that waves reflecting from other interfaces are removed by a destructive interference. In a simplest case, the anti-reflection layer designed for a vertical incidence includes a material with a single quarter-wave layer. A refractive index of the material is close to a geometric average of two neighboring media. In this case, two reflections of the same degree are generated on the interface of the two media and then removed by the destructive interference between them.

The backside passivation layer 125 has a multi-layered structure where materials having different refractive indexes are stacked. The number of layers for the multi-layered structure is not limited and the layers can be selected in a range improving reflection characteristics of the backside passivation layer 125. The backside passivation layer 125 includes a layer having a lower refractive index than the second semiconductor pattern 100-3A. Also, when the backside passivation layer 125 has a stack structure, as the layer comes closer to the backside of the second semiconductor pattern 100-3A, the layer begins to have a low refractive index.

For instance, the backside passivation layer 125 includes a first insulation layer and a second insulation layer. The first insulation layer is formed between the second insulation layer and the second semiconductor pattern 100-3A. The second insulation layer includes a nitride layer. Preferably, the second insulation layer includes a silicon nitride compound. More preferably, the second insulation layer includes a silicon nitride layer or a silicon oxy-nitride layer. Herein, the nitride layer is formed to have a thickness of approximately 50 nm to approximately 500 nm. The first insulation layer includes a material having a refractive index lower than the second insulation layer and lower than the second semiconductor pattern 100-3A. Preferably, the first insulation layer includes an oxide layer. More preferably, the first insulation layer includes a silicon oxide layer. The silicon oxide layer may be one selected from a group consisting of a native silicon oxide layer, a grown silicon oxide layer, and a deposited silicon oxide layer. Herein, the silicon oxide layer is formed to have a thickness of approximately 2 nm to approximately 50 nm.

A transparent conductive layer 126 includes a Transparent Conductive Oxides (TCO). The transparent conductive layer 126 may include one selected from a group consisting of an Indium Tin Oxide (ITO) layer, a Zinc Oxide (which includes ZnO, ZO) layer, a Tin Oxide (which includes SnO, TO) layer and a Zinc Tin Oxide (ZTO) layer. The ITO layer may be doped with one selected from a group consisting of cobalt (CO), titanium (Ti), tungsten (W), molybdenum (Mo) and chrome (Cr). The ZO layer is doped with one selected from a group consisting of magnesium (Mg), zirconium (Zr), and lithium (Li). The TCO layer is formed to have a thickness of approximately 10 nm to approximately 500 nm. The transparent conductive layer 126 may include a polysilicon layer or a metal layer. The polysilicon layer and the metal layer are formed to have a thin thickness to transmit incidence tight to the second semiconductor pattern 100-3A. For instance, the polysilicon layer is formed to have a thickness not greater than approximately 40 nm. Preferably, the polysilicon layer is formed to have a thickness of approximately 1 nm to approximately 40 nm. The metal layer includes a noble metal. For instance, the precious metal includes gold (Au) or platinum (Pt). The precious layer is formed to have a thickness not greater than approximately 1 nm. The precious metal may be formed to have a thickness of approximately 0.1 nm to approximately 1 nm.

The backside illuminated image sensor in accordance with the first embodiment of the present invention includes a first substrate, for example, a light receiving element 106, which is formed in the second semiconductor pattern 100-3A, a first interlayer insulation pattern 108A formed over the second substrate pattern 100-3A, an align key 112 spaced apart from the light receiving element 106 and passing through the first interlayer insulation pattern 108A and the first semiconductor pattern 100-1A, first to fourth interconnection layers 113, 116, 119 and 122 formed over the first interlayer insulation pattern 108A in a multi-layered structure, where the backside of the first interconnection layer 113 among the first to fourth interconnection layers 113, 116, 119 and 122 is connected to the align key 112, a passivation layer 124 covering the interconnection layers 113, 116, 119 and 122, a backside passivation layer 125 disposed on the backside of the first substrate, a transparent conductive layer 126 formed on the backside of the first substrate to be connected to the align key 112, and a color filter 128 and a microlens 130 overlapping the light receiving element 106 disposed on the transparent conductive layer 126.

The first substrate 100 (refer to FIG. 2A) may be a bulk substrate, an epitaxial substrate, or a silicon-on-insulator (SOI) substrate. Considering the device characteristics, an SOI substrate where a first semiconductor layer, a buried insulation layer, and a second semiconductor layer are stacked is used as the first substrate 100, and a relatively cheap bulk substrate is used as the second substrate 200 (refer to FIG. 2E). In this invention, the first and the second substrates 100 and 200 are SOI substrates.

The align key 112 functions as an align mark during a color filter 128 and a microlens 130 formation process. The align key 112 is provided in plurality. The backside of multiple of align keys 112 connect to the transparent conductive layer 126. The top surface of the align key 112 is connected to the first interconnection layer 113 among the first to fourth interconnection layers 113, 116, 119 and 122, and the align key 112 transfers negative voltage applied from a negative voltage applying unit 300 (refer to FIG. 3) to the transparent conductive layer 126. The align key 112 may be formed of a conductive material, for example, a metal or art alloy. In, addition, the align key 112 may be formed in a circular, oval, or polygonal (such as triangular, rectangular, pentagonal, etc.) shape. There is no limitation in the number and size (which is width) of the align key 112.

The backside illuminated image sensor in accordance with the first embodiment of the present invention may include a positive voltage applying unit (not shown) applying positive voltage (+) to the align key 112 or the transparent conductive layer 126, instead of the negative voltage applying unit. 300, to invert the backside of the first substrate 100.

Also, the backside illuminated image sensor in accordance with the first embodiment of the present invention further includes a barrier layer (not shown) surrounding art outer wall of the align key 112. The barrier layer (not shown) may include a metal layer or an insulation layer. More specifically, the metal layer may include a Ti/TiN layer, and the insulation layer may include a nitride layer, e.g., a silicon nitride layer, an oxide layer, e.g., a silicon oxide layer, or a stack structure thereof, e.g., an oxide/nitride layer.

In addition, the backside illuminated image sensor in accordance with the embodiment of the present invention further includes a plurality of transistors for transmitting, and amplifying optical signals of the light receiving element 106. For instance, a driving transistor includes a first substrate pattern 100A, a gate electrode 104 formed between the first substrate pattern 100A and the first interlayer insulation pattern 108A, and source and drain regions 107 formed in the first substrate 100 exposed on both sides of the gate electrode 104.

The backside illuminated image sensor in accordance with the embodiment of the present invention further includes a negative voltage applying unit 300. The negative voltage applying unit 300 directly provides the negative voltage to the transparent conductive layer 126. The negative voltage applying unit 300 also provides the negative voltage to the transparent conductive layer 126 through the align key 112 connected to the transparent conductive layer 126. The negative voltage applying unit 300 can be formed in the second substrate 200.

Figure 4:
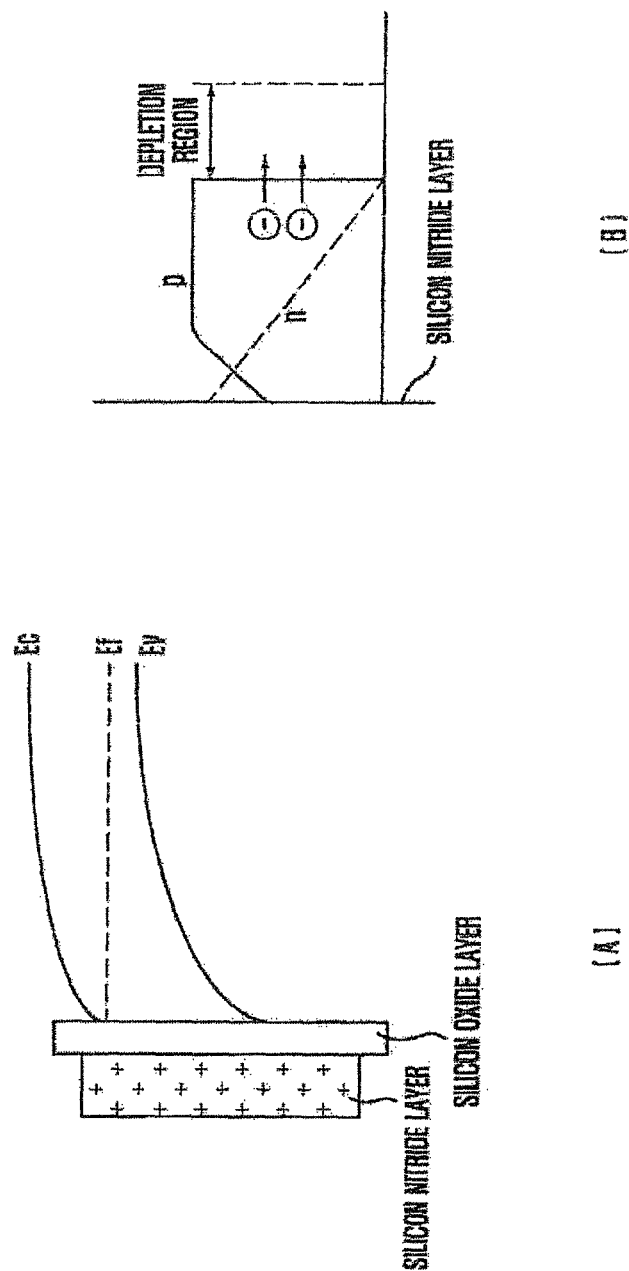
FIG. 4 shows and energy band when a backside passivation layer is a silicon nitride layer.

FIG. 4 shows and energy band when a backside passivation layer is a silicon nitride layer.

Referring to FIG. 4, the silicon nitride layer includes positive charge. The silicon nitride layer including the positive charges inverts the backside of the exposed semiconductor layer. The inverted backside of the substrate reduces surface recombination and surface generation. The reduction in the surface recombination increases quantum efficiency and the reduction in the surface generation reduces dark current leakage.

When the silicon nitride layer connects to the substrate (or a silicon oxide layer and a substrate) in art equilibrium state, charge (which are electrons) is accumulated at an interface between the silicon nitride layer and the substrate because of positive charge in the silicon nitride layer. Thus, valence band (Ev) becomes further away from the fermi level (Ef) at an interface between the silicon nitride layer and the substrate. That is, an inversion state is accomplished. The inversion state results in the conduction band (Ec) becoming closer to the Fermi level (Ef). When the light is illuminated in the inversion state, charge (electrons), i.e., photo current, is generated. This results in even more electrons in the inversion layer that can diffuse towards the light receiving element and the charge (electrons) easily flows into the light receiving element. That is, the photo current generated at the interface easily flows into the light receiving element. Alternatively a positive voltage can be applied to a transparent conductive layer 126 to invert the back surface.

Figure 3:
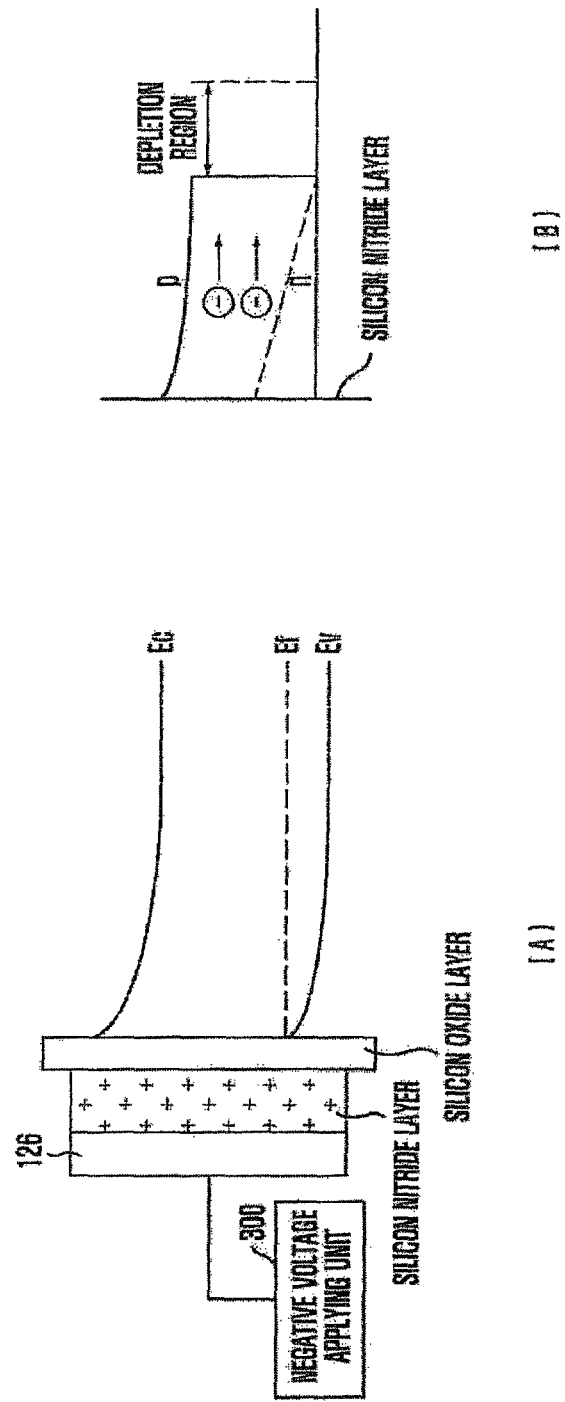
FIG. 3 shows an energy band when negative voltage is applied to a transparent conductive layer.

FIG. 3 shows an energy band when negative voltage is applied to a transparent conductive layer.

Referring to FIG. 3, in the equilibrium state, the valence band (Ev) becomes close to the fermi level (Ef). When the negative voltage is applied to the transparent conductive layer the potential difference between the fermi level (Ef) and conduction band becomes high. It becomes difficult to generate charge (electrons), i.e. dark current, and thus the dark current cannot flow into the light receiving element. When the light is illuminated in this state, charge (electrons), i.e., photo current, is generated and can diffuse towards the light receiving element. That is, the photo current generated at the interface easily flows into the light receiving element, FIGS. 2A to 2J are cross-sectional views of a method for fabricating a backside illuminated image sensor in accordance with a second embodiment of the present invention. In this embodiment, the substrate is an SOI substrate.

The backside illuminated image sensor in accordance with the second embodiment of the present invention has a structure in which a device wafer and a handle wafer 200 are attached together. The device wafer is a wafer where a light receiving element such as a photodiode is formed, and where peripheral circuits such as a digital block and an analog-to-digital converter are formed. In the following description, the device wafer and the handle wafer will be referred to as a first substrate and a second substrate, respectively.

Referring to FIG. 2A, the first substrate 100 is an SOI substrate. The SOI substrate includes a first semiconductor layer 100-1, a buried insulation layer 100-2, and a second semiconductor layer 100-3. The second semiconductor layer 100-3 may be doped with a first conductivity type or a second conductivity type. For instance, the second semiconductor layer 100-3 is doped with the first conductivity type. In addition, the burled insulation layer 100-2 may be formed to have a thickness of approximately 500 Å to approximately 10,000 Å, and the second semiconductor layer 100-3 may be formed to have a thickness of approximately 1 μm to approximately 10 μm.

An isolation layer 101 is locally formed in the first substrate 100. Although the isolation layer 101 may be formed through a Shallow Trench Isolation (STI) process or a LOCal Oxidation of Silicon (LOCOS) process, it is preferable that the isolation layer 101 is formed using the STI process that is advantageous to the realization of high integration density, as illustrated in FIG. 2A. If the STI process is performed, the isolation layer 101 may include a High Density Plasma (HDP) layer, which has an excellent filling characteristic for a high aspect ratio, or a stack structure of an HDP layer and a spin on insulation (SOD) layer.

Gate insulation layer 102 and gate conductive layer 103 are formed over the first substrate 100 and then etched to form a gate electrode 104 of a driving transistor. At the same time, although not shown, gate electrodes of a transfer transistor, a reset transistor, and a select transistor constituting a unit pixel of a CMOS image sensor can be formed.

Spacers 105 may be formed on both sidewalls of the gate electrode 104. The spacers 105 may include an oxide layer, a nitride layer, or a stack structure thereof.

Before the spacers 105 are formed, a gate electrode 104 is formed. A lightly doped drain (LDD) region (not shown) doped with n-type (hereinafter, a second conductivity type) is formed in the first substrate 100 exposed on both sides of the gate electrode 104.

A photodiode serving as a light receiving element 106 is formed in the first substrate 100 through an ion implantation process. In this case, the light receiving element 106 is doped with the second conductivity type. The photodiode has a relatively thin doping profile, in FIG. 2A. However, this is for the convenience and the doping profile (depth, width) can be properly changed.

Source and drain regions 107 doped with the second conductivity type is formed in the first substrate 100 exposed on both sides of the spacers 105. The source and drain regions 107 has a higher doping concentration than the LDD region and the light receiving element 106.

In order to prevent surface noise of the light receiving element 106, a doping region (not shown) doped with the first conductivity type may be further formed to cover the top surface of the light receiving element 106.

Although it has been described above that the gate electrode 104, the spacers 105, the light receiving element 106, and the source and drain regions 107 are sequentially formed, their formation order is not limited to the above embodiment, but may be appropriately changed according to the fabricating processes.

A first interlayer insulation layer 108 is formed to cover the first substrate 100, including the gate electrode 104, the spacers 105, the photodiode 106, and the source and drain region 107. The first interlayer insulation layer 108 may include an oxide layer, for example, a silicon oxide layer (SiO$_2$). More specifically, the first interlayer insulation layer 108 may include one layer selected from the group consisting of a BoroPhosphoSilicate Glass (BPSG) layer, a PhosphoSilicate Glass (PSG) layer, a BoroSilicate Glass (BSG) layer, an Un-doped Silicate Glass (USG) layer, a Tetra Ethyle Ortho Silicate (TEOS) layer, an HDP layer, and a stacked layer thereof. In addition, the first interlayer insulation layer 108 may include a layer such as a Spin On Dielectric (SOD) layer which is deposited by a spin coating process.

Referring to FIG. 2B, an etch process is performed to locally etch the first interlayer insulation layer 108 to form a contact hole 109 exposing the source and drain regions 107. The etch process may be performed using a dry etch process or a wet etch process. It is preferable to perform the dry etching process so that a vertically etched surface can be acquired.

The first interlayer insulation layer 108 and the first substrate 100 are locally etched. Hereinafter, the etched first interlayer insulation layer 108 and the first substrate 100 are called to a first interlayer insulation pattern 108A and first substrate pattern 100A, respectively. Thus, a via hole 110 extending from the first interlayer insulation pattern 108A to a first semiconductor pattern 100-1A is formed. At this point, a plurality of via holes 110 may be formed in a matrix configuration.

More specifically, the via hole 110 has a vertical angle of approximately 88 degrees to approximately 90 degrees and a depth of approximately 20,000 Å from the top surface of the first interlayer insulation pattern 108A, preferably approximately 4,000 Å to approximately 20,000 Å. More preferably, the via hole 110 is formed to a depth of approximately 1,000 Å to approximately 10,000 Å from the top surface of the second semiconductor pattern 100-3A. In addition, the Via hole 110 has a critical dimension (CD) of approximately 0.1 µm to approximately 2.0 µm. The via hole 110 has a bottom width of less than approximately 1.6 µm, preferably approximately 1.0 µm to approximately 1.6 µm. When a plurality of via holes 110 are formed, it is preferable that the deviation in their angles, depths and widths is legs than 4%. Furthermore, there is no limitation in the number and shape of the via hole 110. In particular, the via hole 110 may be formed in various shapes, for example, a circular shape or a polygonal (such as triangular, rectangular, pentagonal, octagonal, etc.) shape.

Meanwhile, there is no limitation in the formation order of the contact hole 109 and the via hole 110. The contact hole 109 may be formed after forming the via hole 110. In addition, the contact hole 109 and the via hole 110 may be formed in-situ within the same plasma etching apparatus.

For example, the via hole 110 is formed using a dry etching process in two steps.

A first step is to etch the first interlayer insulation layer 108. The etching process is performed under the conditions that an etch selectivity of the first interlayer insulation layer 108 to a photoresist pattern (not shown) ranges from 5:1 to 2:1, preferably 2.4:1. In addition, an etch rate is in the range of approximately 7,000 Å/min to approximately 8,000 Å/min, preferably 7,200 Å/min. As the etching conditions, a pressure is in the range of approximately 100 mTorr to approximately 200 mTorr, and a source power is in the range of approximately 100 W to approximately 2,000 W. A carbon fluoride compound, for example, a fluoroform ($CHF_3$) or tetrafluoromethane ($CF_4$), is used as a source gas, and argon (Ar) is further added to the source gas in order to increase an etching speed and anisotropy. A flow rate of $CHF_3$ is in the range of approximately 5 sccm to approximately 200 sccm, a flow rate of $CF_4$ is in the rage of approximately 20 sccm to approximately 200 sccm, and a flow rate of Ar is in the range of approximately 100 sccm to approximately 2,000 sccm.

A second step is to etch the first substrate 100, in the second step, an etch rate is in the range of approximately 1,000 Å/min to approximately 3,000 Å/min, preferably 2,000 Å/min. As the etching conditions, a pressure is in the range of approximately 15 mTorr to approximately 30 mTorr. A source power (e.g., RF power) is in the range of approximately 400 W to approximately 600 W, and a bias power for improving the straightness of ions is in the range of approximately 80 W to approximately 120 W. Sulfur hexafluoride ($SF_6$) and $O_2$ is used as a source gas. A flow rate of $SF_6$ is in the range of approximately 5 sccm to approximately 200 sccm, a flow rate of $O_2$ is in the rage of approximately 1 sccm to approximately 100 sccm.

In the second step, the etch process may be performed to etch a portion of the buried insulation layer 100-2 of to etch the buried insulation layer 100-2 and a portion of the first semiconductor layer 100-1. In the former case, the buried insulation layer 100-2 may be over-etched by approximately 100 Å to approximately 4,000 Å. Hereinafter, the etched buried insulation layer 100-2 and etched first semiconductor layer 100-1 are called buried insulation pattern 100-2A and first semiconductor pattern 100-1A, respectively.

Referring to FIG. 2C, barrier layers (not shown) may be formed on inner surfaces of the contact hole 109 (refer to FIG. 2B) and the via hole 110 (refer to FIG. 2B). The barrier layer may include one layer selected from the group consisting of a titanium (Ti) layer, a titanium nitride (TiN) layer, a tantalum (Ta) layer, a tantalum nitride (TaN) layer, an aluminum silicon titanium nitride (AlSiTiN) layer, a nickel titanium (Niti) layer, a titanium boron nitride (TiBN) layer, a zirconium boron nitride (ZrBN) layer, a titanium aluminum nitride (TiAlN) layer, a titanium diboride ($TiB_2$) layer, and a stack structure thereof, for example, a Ti/TiN layer and a Ta/Tan layer. In order to minimize the reduction in the width of the contact hole 109, especially the via hole 110, the barrier layer is formed to a thickness of less than 100 Å, preferably approximately 50 Å to approximately 100 Å, using an atomic layer deposition (ALD) process having an excellent step coverage, in addition, the barrier layer may be formed through a metal organic chemical vapor deposition (MOCVD) process or a physical vapor deposition (PVD) process.

Furthermore, the barrier layer may include an oxide layer, e.g., a silicon oxide layer, a nitride layer, e.g., a silicon nitride layer, and a stack structure thereof, e.g., a nitride/oxide layer. In the case of the nitride/oxide layer, the oxide layer and the nitride layer are formed in a liner so that the nitride/oxide layer has a total thickness of less than 200 Å. In this way, the reduction in the width of the via hole 110 is minimized.

The contact hole 109 and the via hole 110 are filled with a conductive material to form a first contact plug 111 and an align key 112. The conductive material may include one material selected from the group consisting of copper (Cu), platinum (Pt), tungsten (W), aluminum (Al), and an alloy thereof. The conductive material is not limited to the above-listed materials, but includes any metal or metal alloy having conductive properties. When the W is used as the conductive material, a chemical vapor deposition (CVD) process or an ALD process is performed. When the Al is used as the conductive material, a CVD process is used. When copper (Cu) is used as the conductive material, an electroplating process or a CVD process is performed.

Meanwhile, as described above, the first contact plug 111 and the align key 112 may be formed at the same time. Also, the align key 112 may be formed after forming the first contact plug 111, or vice versa. When the first contact plug 111 and the align key 112 are not formed at the same time, they may be formed of different materials. For example, the first contact plug 111 is formed of impurity-doped polysilicon, and the align key 112 is formed of the above-described material.

Figure 2D:
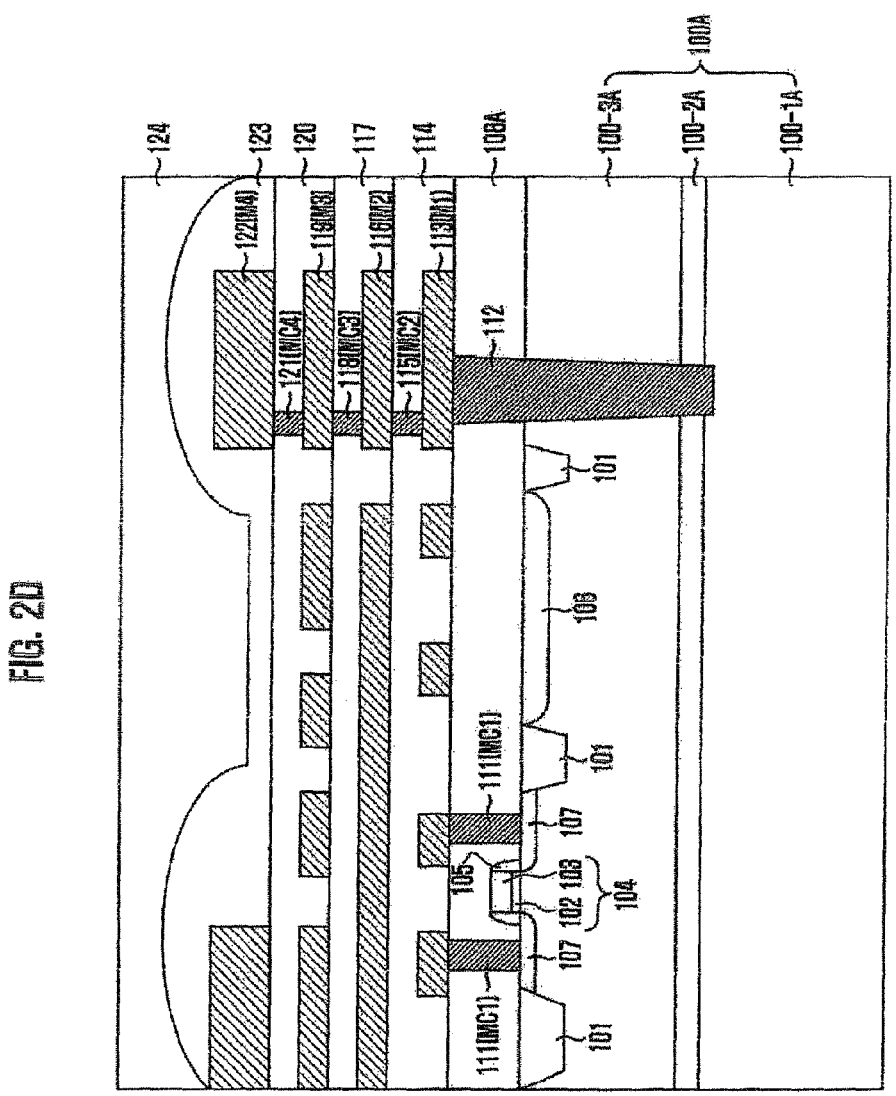

Referring to FIG. 2D, first to fourth interconnection layers 113, 116, 119 and 122, second to fourth contact plugs 115, 118 and 121, second to fifth interlayer insulation layers 114, 117, 120 and 123 are formed. For example, a portion of the first interconnection layer 113 among the first to fourth interconnection layers 113, 116, 119 and 122 is electrically separated from and connected to the first contact plug 111, and another portion of the first interconnection layer 113 is connected to the align key 112.

The first to fourth interconnection layers 113, 116, 119 and 122 are formed through a deposition process and an etching process. The first to fourth interconnection layers 113, 116, 119 and 122 are formed of a conductive material, for example, a metal, or an alloy containing at least two metals. Preferably, the first to fourth interconnection layers 113, 116, 119 and 122 are formed of aluminum (Al). The second to fourth contact plugs 115, 118 and 121 are formed in the second to fifth interlayer insulation layers 114, 117, 120 and 123 through a damascene process. In order to electrically connect the first to fourth interconnection layers 113, 116, 119 and 122 that are vertically stacked, the second to fourth contact plugs 115, 118 and 121 are formed of a conductive material, for example, an impurity-doped polysilicon and a metal, or an alloy containing at least two metals. Preferably, the second to fourth contact plugs 115, 118 and 121 are formed of tungsten (W). The second to fifth interlayer insulation layers 114, 117, 120 and 123 may include an oxide layer selected from the group consisting of a BPSG layer, a PSG layer, a BSG layer, an USG layer, a TEOS layer, an HDP layer, and a stack structure thereof. In addition, the second to fourth interlayer insulation layers 114, 117 and 120 may be planarized using a CMP process.

There is no limitation in the layer number and structure of the first to fourth interconnection layers 113, 116, 119 and 122 and the second to fourth contact plugs 115, 118 and 121. The layer number and structure of the interconnection layers and the contact plugs may be variously changed according to the device design.

A front side passivation layer 124 is formed over the fifth interlayer insulation layer 123. The front side passivation layer 124 may include one layer selected from the group consisting of a BPSG layer, a PSG layer, a BSG layer, an USG layer, a TEOS layer, and an HDP layer. Preferably, the front side passivation layer 124 is formed using the TEOS layer or the HDP layer to a thickness of approximately 1,000 Å to approximately 40,000 Å. In addition, the front side passivation layer 124 may include a nitride layer or a stack structure of an oxide layer and a nitride layer.

The front side passivation layer 124 is planarized. The planarization process may be performed through a chemical mechanical polishing (CMP) process.

A thermal treatment may be performed for densifying the front side passivation layer 124. The thermal treatment may be performed through an annealing process using a furnace.

Figure 2E:
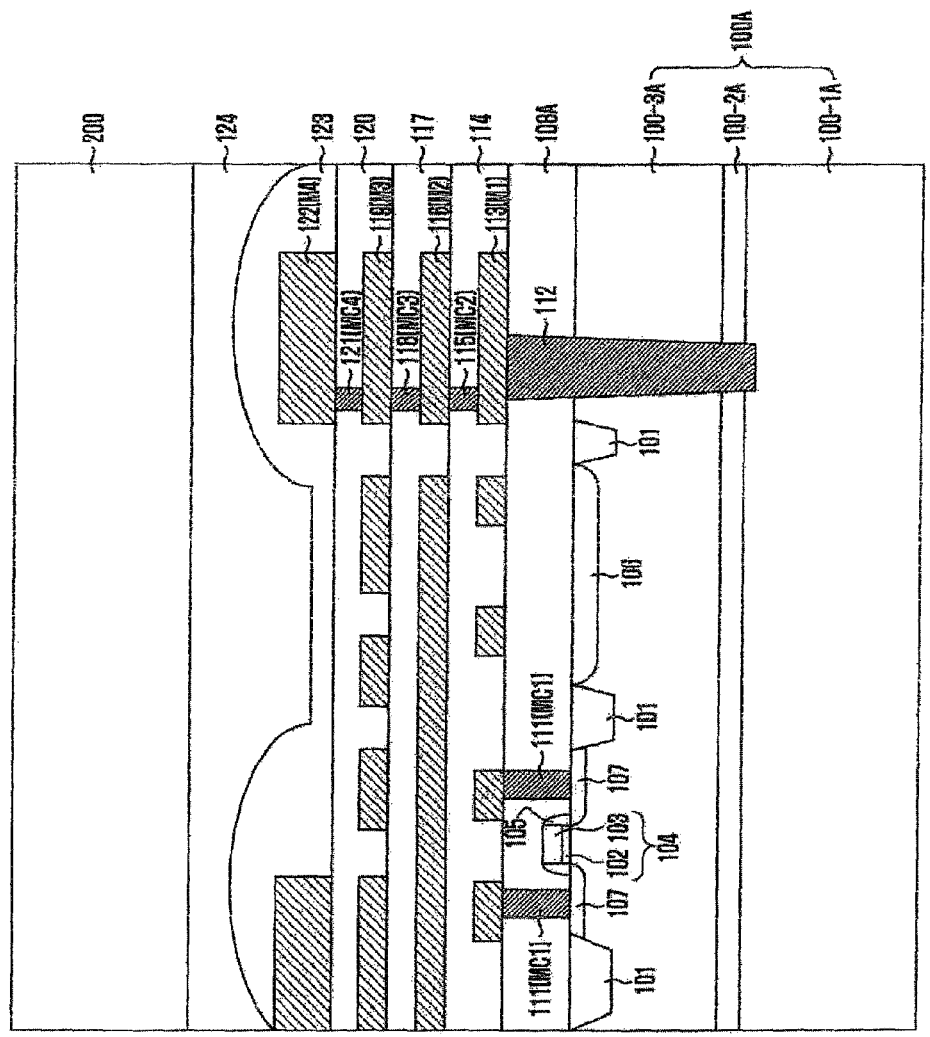

Referring to FIG. 2E, the first, substrate pattern 100A fabricated through the processes of FIGS. 2A to 2D is bonded to a second substrate 200. The bonding process is performed using one method selected from the group consisting of an oxide/oxide bonding, an oxide/silicon bonding, an oxide/metal bonding, an oxide/adhesive/oxide bonding, and an oxide/adhesive/silicon bonding.

For example, the oxide/oxide (formed over the second substrate 200) bonding and the oxide/silicon (silicon substrate) bonding are to bond the two substrates after a plasma treatment using $O_2$ or $N_2$ and a water treatment. In addition to the method of bonding two substrates after the water treatment, the two substrates can be bonded together after a chemical treatment using amine. In the oxide/metal (formed over the second substrate 200) bonding, the metal layer may be formed of a metal such as titanium (Ti), aluminum (Al) or copper (Cu). In the oxide/adhesive/oxide bonding and the oxide/adhesive/silicon bonding, Benzo Cyclo Butene (BCB) may be used as the adhesive member.

Referring to FIG. 2F, a back grinding process is performed to grind the backside of the first substrate pattern 100A (refer to FIG. 2E). In this case, if the align key 112 is formed to pass through the buried insulation pattern 100-2A, the align key 112 is exposed by performing the back grinding process until the buried insulation pattern 100-2A is exposed. During this process, the buried insulation pattern 100-2A may be removed by a predetermined thickness. Meanwhile, if the align key 112 is formed not to pass through the buried insulation pattern 100-2A, that is, the align key 112 extends into the buried insulation pattern 100-2A by a predetermined depth, the buried insulation pattern 100-2A may be partially or entirely removed to expose the align key 112. Alternatively, the buried insulation pattern 100-2A may be etched through a separate etch process.

Referring to FIG. 2G, the buried insulation pattern 100-2A (refer to FIG. 2F) remaining on the second semiconductor pattern 100-3A is locally removed. The removal process is performed through a wet etch process. For instance, when the buried insulation pattern 100-2A includes the silicon nitride layer, the wet etch process is performed using a Buffered Oxide Etchant (BOE) or Diluted HF (DHF).

Referring to FIG. 2H, a backside passivation layer 125 is formed over the second semiconductor pattern 100-3A where the buried insulation pattern 100-2A (refer to FIG. 2F) is removed. The backside passivation layer 125 has a stack structure of a first insulation layer and a second insulation layer having different refractive indexes. The silicon oxide layer may be one selected from the consisting of a native oxide layer, a grown oxide layer, and a deposition oxide layer. The grown oxide layer is formed through one of a dry oxidation process, a wet oxidation process, and a radical ion oxidation process. The deposition oxide layer is formed through a Chemical Vapor Deposition (CVD) process. The silicon oxide layer and the silicon nitride layer are formed to have a thickness of approximately 2 nm to approximately 50 nm and approximately 100 nm to approximately 500 nm, respectively.

Meanwhile, the deposition process of the backside passivation layer 125 having the multi-layered structure may be performed in-situ within the same chamber in order to obtain the increased stability and the reduced processing time of the fabrication process. If the in-situ process is impossible, the deposition process, may be performed ex-situ in a different chamber.

In the backside passivation layer 125, the silicon nitride layer is deposited on the backside of the align key 112. However, an etch-back process or a CMP process is additively performed to selectively remove a portion deposited on the backside of the align key 112. Thus, the backside of the align key 112 is exposed.

Figure 2I:
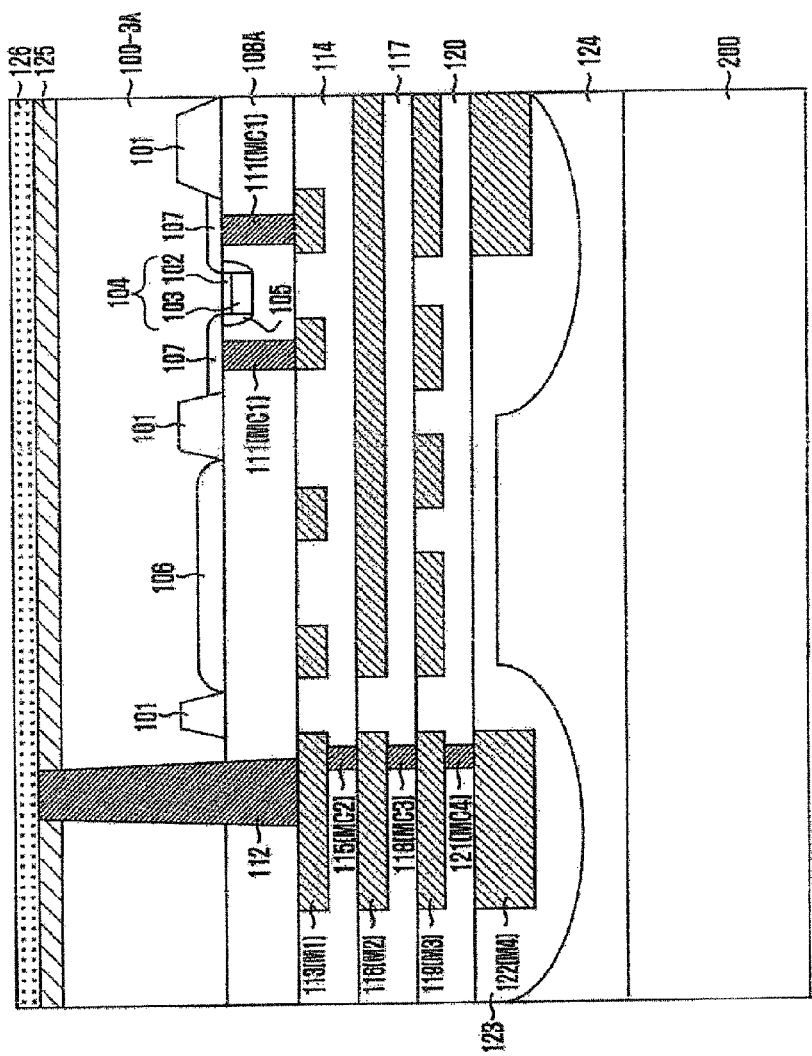

Referring to FIG. 2I, a transparent conductive layer 126 is formed over the backside passivation layer 125. The transparent layer 126 is a TCO layer. The transparent layer 126 may include one selected from a group consisting of an ITO layer, a ZO layer, a SnO and a ZTO layer. The ITO layer is doped with one selected from a group consisting of CO, Ti, W, Mo, and Cr. The ZO layer may be doped with one selected from the group consisting of Mg, Zr, and Li. The TCO layer is formed to have a thickness of approximately 10 nm to approximately 500 nm. The transparent conductive layer 126 may include a polysilicon layer or a metal layer. The polysilicon layer is formed to have a thickness of approximately 1 nm to approximately 40 nm for the light penetration. The metal layer may be gold (Au) or platinum (Pt). The metal layer is formed to have a thickness of approximately 0.1 nm to approximately 1 nm.

Figure 2J:
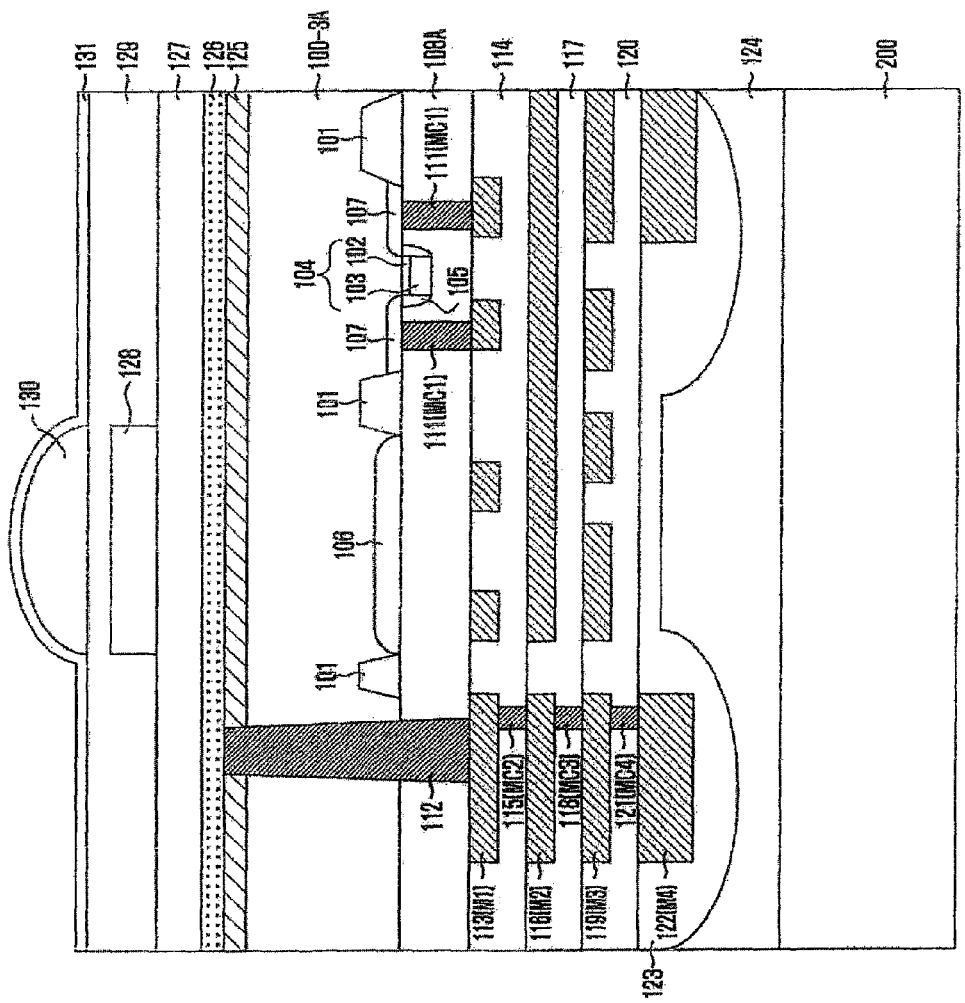

Referring to FIG. 2J, a first planarization layer 127 may be formed over the transparent conductive layer 126. The first planarization layer 127 may be formed of an organic material.

Color filter 128 and microlens 130 are formed over the first planarization layer 127. A second planarization layer 129 may be formed between the color filter 128 and the microlens 130. The second planarization layer 129 may be formed of an organic material.

Then, a low temperature oxide (LTO) layer 130 is formed to cover the microlens 130.

The first substrate pattern 100A and the second substrate 200 are packaged by a packaging process. The packaging process includes a wire bonding process and a sawing process. The wire bonding is achieved by bonding a pad to an external chip through a wire. The connection of a through silicon via interconnect 112 to a bonding pad rather than the transparent conductive oxide is accomplished by conventional techniques.

The embodiments of the present invention can obtain the following effects.

First, compared with the typical CMOS image sensor (a front-side illuminated image sensor), the backside illuminated image sensor where light is illuminated from the backside of the substrate (e.g., semiconductor device) can minimize toss of light incident onto the light receiving element, thereby increasing the light receiving efficiency.

Second, the backside passivation layer is formed for preventing the reflection of light incident onto the backside of the substrate. Therefore, the light collecting efficiency of the light receiving element can be increased to improve the light receiving efficiency.

Third, the transparent conductive layer is formed on the backside passivation, layer of the substrate (e.g., semiconductor layer). Negative voltage (−) is applied to the transparent conductive layer. Thus, it is possible to minimize the generation of dark current and prevent dark current from the backside of the substrate flowing into the light receiving element. Alternatively a positive voltage (+) is applied to the transparent conductive layer to invert the back surface to prevent dark current from the backside of the substrate.

Fourth, in the method for fabricating the backside illuminated image sensor using the back grinding process, the align key having a via hole shape is formed in the substrate before the back grinding process of grinding the backside of the substrate, and the backside grinding target of the substrate is controlled during the back grinding process. Therefore, the control of the back grinding process is facilitated.

Fifth, the backside of the align key connects to the transparent conductive layer. Thus, the negative voltage applied by the negative applying unit is transmitted to the transparent conductive layer through the align key. The negative voltage applying unit may be disposed on the second substrate, not the first, substrate. Various designs, are possible in the packaging process.

While the present invention has been described with respect to the specific embodiments, the above embodiments of the present invention are and not limitative but illustrative. Particularly, although the present invention is applied to the CMOS image sensor in the embodiment, the present invention can be applied to any other Charge Coupled Device (CCD), backside illuminated image sensors or 3D structure integrated devices.

It will be apparent to those skilled in the art that various changes and modifications may be made without departing from the spirit and scope of the invention as defined in the following claims.

The invention claimed is:

1. A method for manufacturing a backside illuminated image sensor, the method comprising:

forming a light-receiving element in a front side of a substrate;

forming a patterned conductive layer over the front side of the substrate, wherein the patterned conductive layer includes an interconnection layer and an interlayer insulation layer;

forming an align key spaced apart from the light-receiving element and passing through the interlayer insulation layer and the substrate, wherein the patterned conductive layer is electrically coupled to the align key;

forming a backside passivation layer over a backside of the substrate;

forming a transparent conductive layer over the backside passivation layer and the light-receiving element, wherein the transparent conductive layer is electrically coupled to the align key;

forming a front side passivation layer over a front side of the patterned conductive layer; and attaching, to the front side passivation layer, a further substrate comprising a voltage applying unit that is configured to apply a voltage to the transparent conductive layer via the align key.

2. The method of claim 1, further comprising forming both a color filter and a microlens over the transparent conductive layer proximate the light-receiving element.

3. The method of claim 1, wherein said attaching a further substrate comprises bonding a silicon-on-insulator substrate over the front side passivation layer.

4. The method of claim 1, wherein said forming a backside passivation layer comprises forming a backside passivation layer having a multi-layered structure, wherein refractive indexes of the multi-layer structure decrease as each layer of the multi-layer structure is positioned closer to the backside passivation layer.

5. The method of claim 1, wherein said forming a backside passivation layer comprises forming a backside passivation layer including a layer having a lower refractive index than the substrate.

6. The method of claim 1, wherein said forming a transparent conductive layer comprises forming a transparent conductive layer from a material selected from the group consisting of ITO, ZO, SnO, and ZTO.

7. The method of claim 6, wherein said forming a transparent conductive layer comprises forming a transparent conductive layer including an ITO layer, and wherein the method further comprises doping the ITO layer with an impurity selected from the group of impurities consisting of Co, Ti, W, Mo, and Cr.

8. The method of claim 6, wherein said forming a transparent conductive layer comprises forming a transparent conductive layer including a ZO layer, and wherein the method further comprises doping the ZO layer with an impurity selected from the group of impurities consisting of Mg, Zr, and Li.

9. The method of claim 1, wherein said forming a transparent conductive layer comprises forming a transparent conductive layer having a polysilicon layer, a precious metal layer, or both.

10. A method for manufacturing a backside illuminated image sensor, the method comprising:

forming a light-receiving element in a front side of a substrate;

forming an interlayer insulation layer on the front side of the substrate;

forming an align key spaced apart from the light-receiving element and passing through the interlayer insulation layer and the substrate;

forming, on the interlayer insulation layer, a patterned conductive layer that is electrically coupled to the align key;

forming a backside passivation layer over a backside of the substrate;

forming a transparent conductive layer over the backside passivation layer and the light-receiving element, wherein the transparent conductive layer is electrically coupled to the align key; and forming a voltage applying unit that is configured to apply a voltage to the transparent conductive layer via the align key.

11. The method of claim 10, further comprising forming both a color filter and a microlens over the transparent conductive layer proximate the light-receiving element.

12. The method of claim 10, further comprising:

forming a front side passivation layer over a front side of the patterned conductive layer; and forming a further substrate over the front side passivation layer.

13. The method of claim 12, wherein said forming a further substrate over the front side passivation layer comprises bonding a silicon-on-insulator substrate over the front side passivation layer.

14. The method of claim 10, wherein said forming a backside passivation layer comprises forming a backside passivation layer having a multi-layered structure, wherein refractive indexes of the multi-layer structure decrease as each layer of the multi-layer structure is positioned closer to the backside passivation layer.

15. The method of claim 10, wherein said forming a backside passivation layer comprises forming a backside passivation layer including a layer having a lower refractive index than the substrate.

16. The method of claim 10, further comprising:

forming a front side passivation layer over a front side of the patterned conductive layer; and attaching, to the front side passivation layer, a further substrate comprising the voltage applying unit that is configured to apply the voltage to the transparent conductive layer via the align key.

17. The method of claim 10, further comprising forming the voltage applying unit such that the voltage applying unit applies a negative voltage to the transparent conductive layer via the align key.

18. The method of claim 10, further comprising forming the voltage applying unit such that the voltage applying unit applies a positive voltage to the transparent conductive layer via the align key.

* * * * *